(12) United States Patent
Haehn et al.

(10) Patent No.: US 6,261,870 B1
(45) Date of Patent: Jul. 17, 2001

(54) BACKSIDE FAILURE ANALYSIS CAPABLE INTEGRATED CIRCUIT PACKAGING

(75) Inventors: Steven L. Haehn, Colorado Springs; William H. Harmon, Manitou Springs, both of CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/143,083

(22) Filed: Aug. 28, 1998

(51) Int. Cl.[7] .................................................. H01L 21/44
(52) U.S. Cl. ........................... 438/124; 438/106; 438/127; 438/126; 257/676
(58) Field of Search ................................... 438/106, 110, 438/123, 124, 126, 127; 257/676, 786, 787, 774; 324/755

(56) References Cited

U.S. PATENT DOCUMENTS

| | | | |
|---|---|---|---|
| 4,784,721 | * 11/1988 | Holmen et al. | 156/647 |
| 5,064,498 | * 11/1991 | Miller | 156/626 |
| 5,155,068 | * 10/1992 | Tada | 438/125 |
| 5,252,842 | * 10/1993 | Buck et al. | 257/280 |
| 5,351,163 | * 9/1994 | Dawson et al. | 361/321.1 |
| 5,604,376 | * 2/1997 | Hamburgen | 257/676 |
| 5,625,209 | * 4/1997 | Appleton et al. | 257/253 |
| 5,698,474 | * 12/1997 | Hurley | 438/15 |
| 5,707,485 | * 1/1998 | Rolfson et al. | 156/643.1 |
| 5,990,562 | * 11/1999 | Vallett | 257/774 |
| 6,020,748 | * 2/2000 | Jeng | 324/755 |

* cited by examiner

*Primary Examiner*—Charles Bowers
*Assistant Examiner*—Hsien Ming Lee
(74) *Attorney, Agent, or Firm*—Christopher P. Maiorana, P.C.

(57) ABSTRACT

A backside failure analysis capable integrated circuit package having a removable plug for exposing the backside of the die or a cavity on the backside of the package for exposing the backside of the die. The package uses either a standard lead frame which must be removed prior to conducting a backside failure analysis or a non-standard lead frame which provides for access to the back side of the die.

9 Claims, 5 Drawing Sheets

BACKSIDE FAILURE ANALYSIS CAPABLE INTEGRATED CIRCUIT PACKAGING

BACKGROUND OF THE INVENTION

1. Technical Field

The present invention relates to an integrated circuit package allowing easy access to the backside of the device for the purpose of failure analysis and, more particularly, to integrated circuit packages having an exposed backside or removable plug.

2. Description of Related Art

Integrated circuit packages are commonly inspected in order to detect defects in the manufacture of the package and, in particular, the encapsulated die. The process of analyzing defective packages to discover the cause of the defects is commonly referred to in the semiconductor industry as "failure analysis." Advancements in the very large-scale integration ("VLSI") processing related to higher integration and multiple level metalization schemes have greatly limited the ability to perform conventional failure analysis from the topside of the die. The semiconductor industry's response to this problem has been the development of backside failure analysis techniques. Backside emission microscopy is one of the most popular failure analysis techniques presently used in the semiconductor industry.

Examples of methods for removing silicon from the backside of semiconductor devices are disclosed in U.S. Pat. No. 5,252,842 (Buck et al.), U.S. Pat. No. 5,064,498 (Miller), U.S. Pat. No. and 4,784,721 (Holmen et al.). All backside techniques require that the package be opened using a combination of chemical and mechanical processes. In many cases the silicon must also be thinned after removing any packaging material. Because silicon, and especially doped silicon, is not perfectly transparent to near IR wave lengths of light, the silicon die must also be thinned. The most popular technique for opening IC packages involves the use of a mechanical grinder. Such systems are costly (about $50,000 to $70,000 each) and also expose the device to mechanical damage that could render the device unsuitable for electrical failure analysis. In fact, both mechanical and chemical etches are prone to cause damage to the die by chipping it or cracking it, thus leaving the device useless for most failure analysis procedures.

Accordingly, a need exists for an integrated circuit package that allows for easy access for backside failure analysis. The backside accessibility should ideally be accomplished at minimum cost and with the minimum potential for collateral damage to the package die.

SUMMARY OF THE INVENTION

A generic backside failure analysis capable integrated circuit package is provided in which the package is manufactured with an exposed backside or a removable plug. In the removable plug configuration, removal of the plug provides access for the purposes of backside failure analysis. Either configuration can utilize a standard or non-standard lead frame. When using a standard lead frame, the lead frame paddle is removed before the backside failure analysis begins. The non-standard package utilizes a lead frame which has been modified so that a majority of the die is not covered by the supporting paddle. Thus, it is not necessary to remove any portion of the paddle before conducting failure analysis. This invention allows easy access to the backside of a packaged device improving the failure analysis capabilities of the product.

The above as well as additional features and advantages of the present invention will become apparent in the following written detailed description.

BRIEF DESCRIPTION OF THE DRAWINGS

The novel features believed characteristic of the invention are set forth in the appended claims. The invention itself, however, as well as a preferred mode of use, further objectives and advantages thereof, will be best understood by reference to the following detailed description of illustrative embodiments when read in conjunction with the accompanying drawings, wherein:

DETAILED DESCRIPTION

Figure 1:
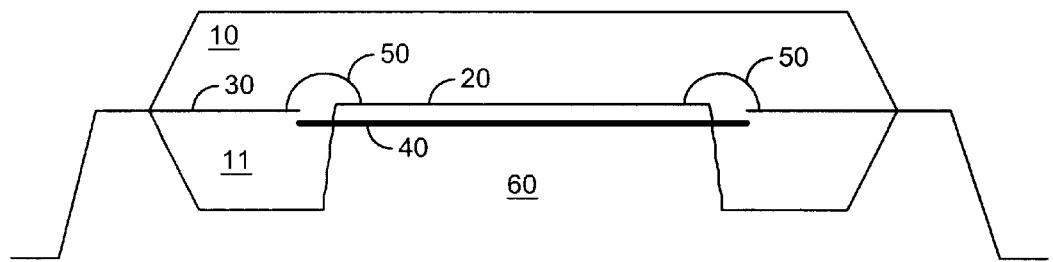
FIG. 1 illustrates a cross-sectional side view of the exposed backside with standard lead frame embodiment of the invention.
Figure 7:
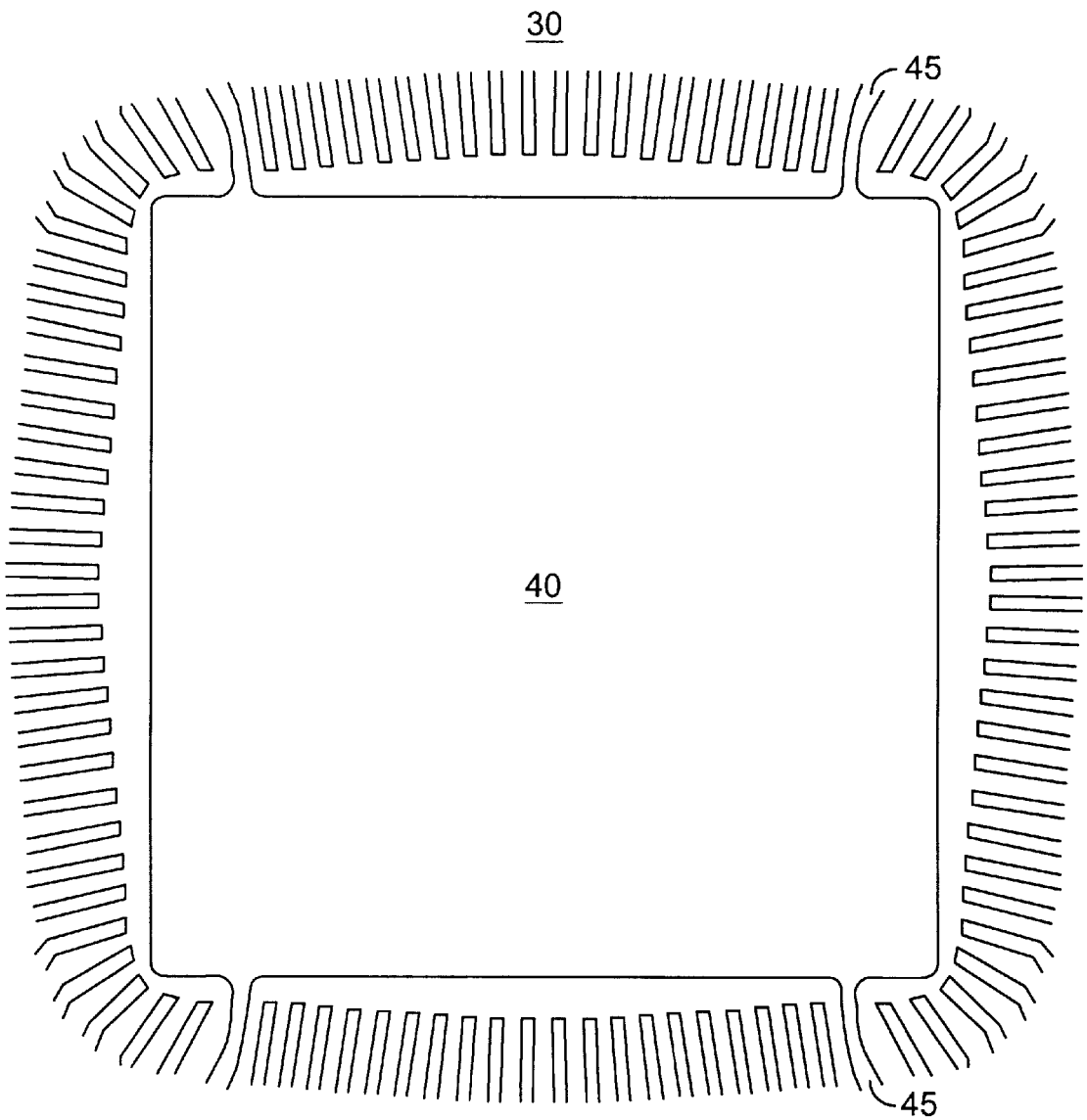
FIG. 7 illustrates an overhead view of a standard lead frame paddle.

FIG. 1 shows a cross-sectional side view of the exposed backside with standard lead frame embodiment of the present invention. Illustrated is an entire integrated circuit package which has been cutaway to reveal the inner components surrounded by an upper encapsulant layer 10 and a lower encapsulant layer 11. Within the encapsulant layers 10, 11, is the die 20 which has been mounted to a lead frame 30. The die 20 rests on the lead frame paddle 40. The lead frame paddle 40 is connected to the lead frame 30 by fingers 45, as shown in FIG. 7. The lead frame paddle 40 configuration will be described in more detail below.

Also shown in FIG. 1 are bond wires 50 which attach the lead frame to I/O cell sites on the die 20. In a prior art IC package, the area immediately below the die 20 and lead frame paddle 40 is enclosed, thus making the lower encapsulant layer 11 contiguous along the bottom of the lead frame 30 and lead frame paddle 40. The present invention, however, leaves open a backside exposure 60 to allow easy access to the backside 21 (shown in FIG. 2) of the die 20. FIG. 1 shows a standard lead frame configuration where the entire die 20 is supported by the lead frame paddle 40. In this standard lead frame configuration the lead frame paddle 40 would have to be removed using present art method before beginning a backside failure analysis.

Figure 2:
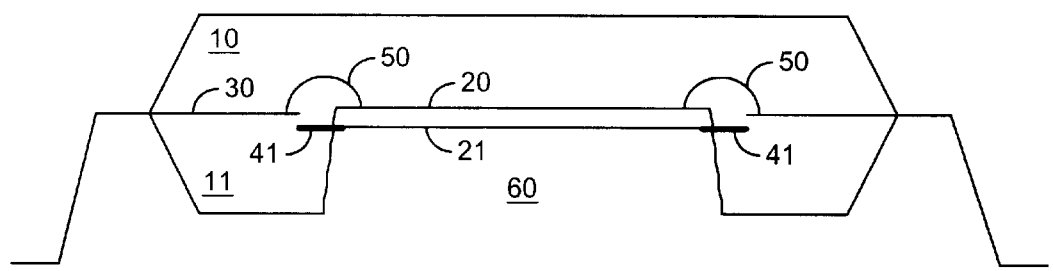
FIG. 2 illustrates a cross-sectional side view of the exposed backside with non-standard lead frame embodiment of the invention.

FIG. 2 shows the present invention in the exposed backside embodiment using a non-standard lead frame. Corresponding reference numerals are used to represent corresponding elements unless indicated otherwise. As with FIG.

1, FIG. 2 is a cutaway of an integrated circuit package exposing the components surrounded by an upper encapsulant layer 10 and a lower encapsulant layer 11. The die 20 is shown mounted on lead frame 30 and connected to the lead frame 30 by bond wires 50. The lead frame paddle 41, however, has been modified to provide support for the die 20 only along the periphery of the die 20. This modification allows for access to the backside of the die 20 through the exposed backside area 60. Consequently, in the embodiment shown in FIG. 2 it is not necessary to remove the lead frame paddle 41 prior to conducting backside failure analysis on the die 20. As with a standard lead frame design, the non-standard lead frame attaches the paddle 41 by way of fingers 45 such as those illustrated in FIG. 8.

Figure 8:
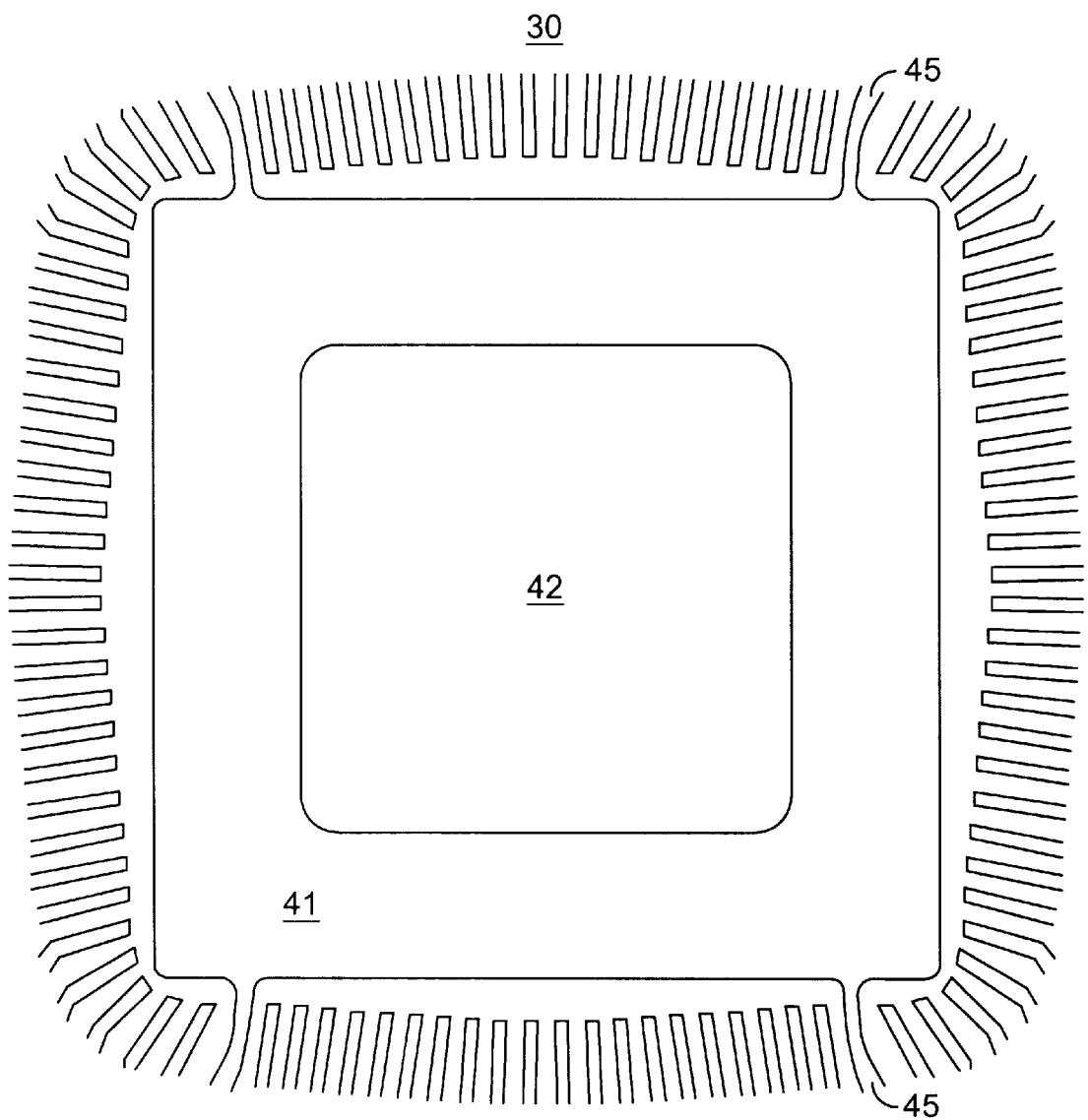
FIG. 8 illustrates an overhead view of a non-standard lead frame paddle.
Figure 9:
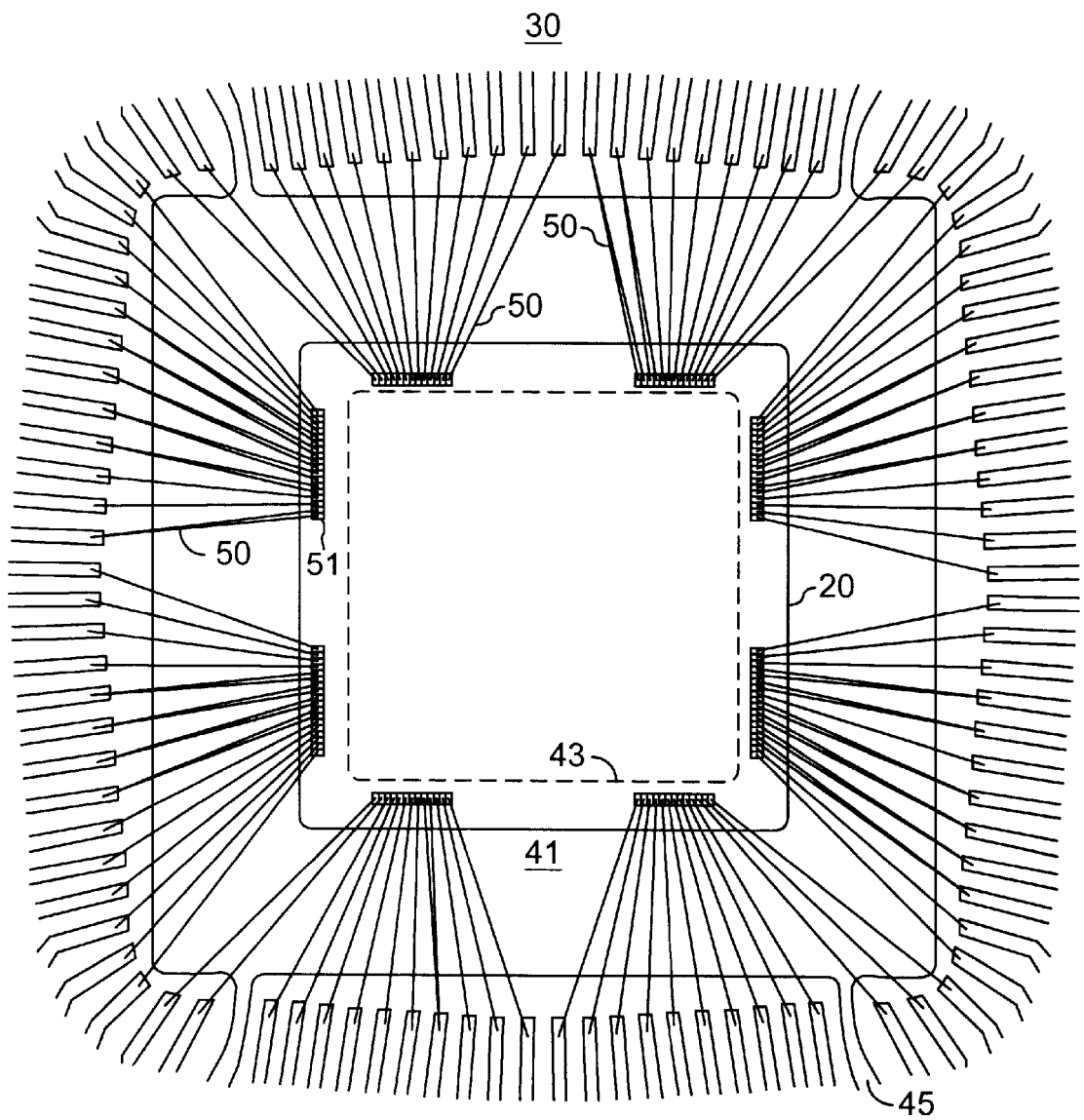
FIG. 9 illustrates an overhead view of a wire bonded die mounted on a lead frame paddle.

The difference between the standard lead frame 40 and the non-standard lead frame 41 is illustrated by FIGS. 7 and 8. FIG. 7 is an overhead view of the standard paddle 40 connected by fingers 45 to the lead frame 30 (which is only partially shown). In the standard lead frame configuration, the paddle 40 is a continuous plane on which a semiconductor die is placed. On the non-standard embodiment illustrated by FIG. 8, however, the lead frame paddle 41 has been cut away, thus leaving a cavity 42 in the center of the lead frame paddle. This cavity 42 would be of the same shape and slightly smaller then the horizontal dimensions of the supported semiconductor die. Therefore, when the die is placed on the non-standard lead frame paddle 41 the cavity 42 in the lead frame paddle 41 provides access to the backside of the die. This is further illustrated by FIG. 9, which is an overhead view of a lead frame 30 (partially shown) supporting a wire bonded die 20. The lead frame paddle 41 is in the non-standard configuration with the cavity 42 allowing access to the backside of the die 20 as illustrated by the dashed lines 43. Further shown are bond wires 50 connected from the lead frame to I/O cell sites 51 arranged around the periphery of the die 20.

Figure 3:
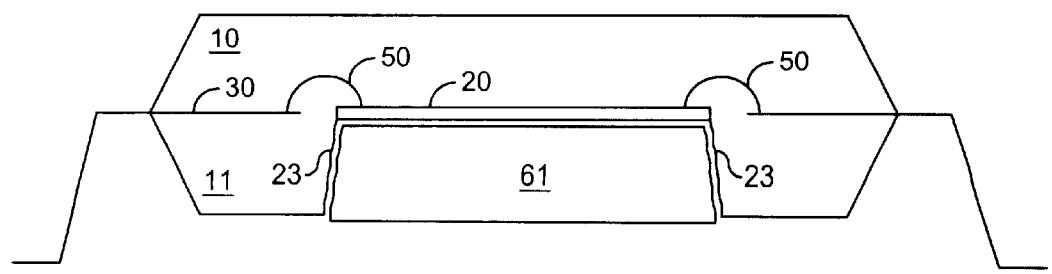
FIG. 3 illustrates a cross-sectional side view of the removable plug embodiment of the invention.

FIG. 3 shows a cross-sectional view of the present invention in a removable plug embodiment. As with FIGS. 1 and 2, FIG. 3 illustrates a side view of an integrated circuit package cutaway to expose the components surrounded by an upper encapsulant layer 10 and a lower encapsulant layer 11. The die 20 is again mounted in a lead frame 30 and connected by way of bond wires 50. Rather than an exposed backside, however, this embodiment of the invention uses a removable plug 61 for access to the backside 21 of the die 20. As shown in FIG. 3, the hole in which plug 61 has inserted is slightly tapered side walls 23 with a wider dimension at the bottom of the package compared to the dimension of the hole near the die 20. Likewise, the plug 61 is tapered with a wider dimension at the exposed backside of the plug 61 as compared to the interface of the plug 61 with the die 20. This tapered fit allows for easy mechanical extraction of the plug 61 away from the hole formed in the lower encapsulant layer 11. A mechanical extraction of the plug 61 could be accomplished, for example, by inserting a screw bit in the exposed backside of the plug 61 and pulling the plug 61 out of the tapered hole in the lower encapsulant layer 11. The plug could also be removed by dissolving the plug with a solvent. For example, the encapsulant layers 10, 11 could be made with MP 8000 distributed by Nitto or 6300 distributed by Sumitomo, while the plug 61 could be made with UDEL Polysulfone distributed by Amoco. To remove the plug 61, the lower encapsulant layer 11 and plug 61 could be exposed to polar organic solvents, for example, and without limitation, esters, ketones, chlorinated hydrocarbons, or aromatic hydrocarbons (benzene), which are effective solvents on polysulfone but would leave the encapsulant material in the substrate layer 11 intact.

Not shown in FIG. 3 is the lead frame paddle. The removable plug embodiment of the present invention could be used with either the standard lead frame paddle 40 illustrated in FIGS. 1 and 7 or the non-standard lead frame paddle 41 illustrated in FIGS. 2 and 8. When the non-standard lead frame paddle 41 used, the backside failure analysis can occur after simply removing the plug 61. When the standard lead frame paddle 40 is used, a portion of the lead frame paddle is removed by present art methods prior to beginning the backside failure analysis.

Figure 4:
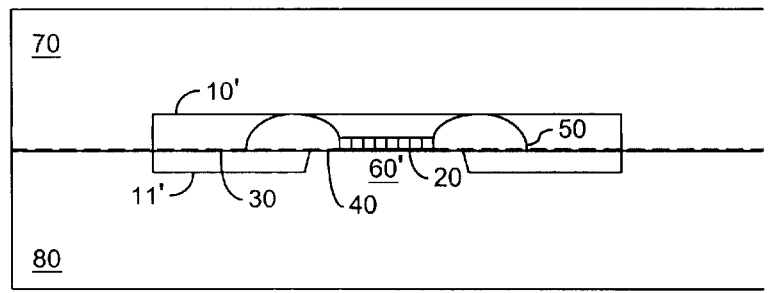
FIG. 4 illustrates a cross-sectional side view of a mold for manufacturing the exposed backside embodiment.
Figure 5:
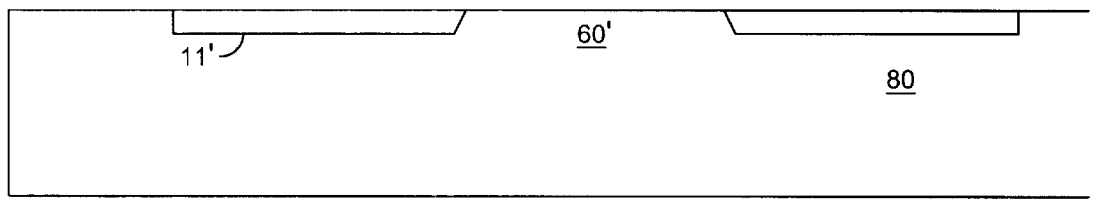
FIG. 5 illustrates a cross-sectional side view of the bottom half of a mold for manufacturing the exposed backside embodiment.

FIG. 4 shows a cross-sectional side view of an IC package mold showing a mounted and bonded die 20 in place. The mold has an upper half 70 and a lower half 80. FIG. 4 illustrates an upper cavity 10' and a lower cavity 11' within the upper half-70 and lower half 80, respectfully. It is into these cavities 10', 11' that the surrounding substrate material is injected to form the upper encapsulant layer 10 and the lower encapsulant layer 11 illustrated in FIGS. 1 through 3. FIG. 4 shows the die 20 mounted in the lead frame 30. The die 20 is likewise connected to the lead frame 30 by bond wires 50. On the lower half 80 is shown a tapered pedestal 60' on which the die 20 and lead frame paddle 40 rests. This pedestal 60', by protruding through the lower cavity 11', creates the backside cavity 60 illustrated in FIGS. 1 and 2. This feature is also illustrated in FIG. 5, which is a cross-sectional side view of the lower half 80 of the mold. FIG. 5 shows the pedestal 60' protruding through the lower cavity 11 ' to a position on which the lead frame and die would be placed.

Figure 6:
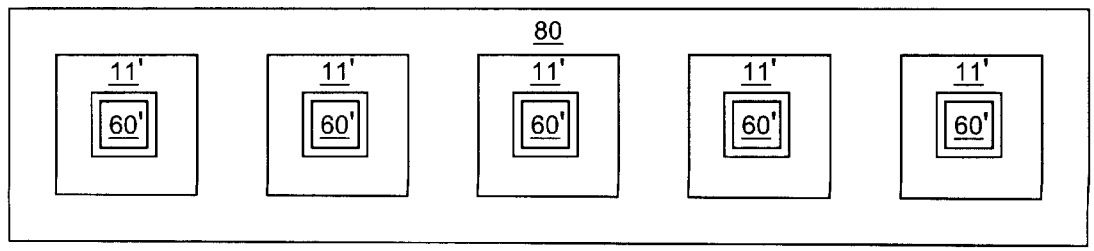
FIG. 6 illustrates an overhead view of the bottom half of a mold for manufacturing the exposed backside embodiment.

The bottom half of the mold 80, with five separate mold casts, is illustrated from an overhead view in FIG. 6. FIG. 6 shows five lower cavities 11', each with a center pedestal 60' protruding into the respective lower cavity 11'.

Both the open backside embodiments of the invention illustrated in FIGS. 1 and 2 and the backside plug embodiment of the invention illustrated in FIG. 3 could be fabricated in the molds illustrated by FIGS. 4, 5, and 6. The plug 61 in the backside plug embodiment of FIG. 3 could be manufactured in a separate mold and inserted into the backside cavity 60 after the die package is removed from the molds illustrated in FIGS. 4, 5, and 6. The plug 61 could then be fitted in place and sealed by the application of a sealant material, such as cyano acrylate adhesives ("super glue") distributed by various manufacturers. The plug 61 could also be backfilled into the cavity 60 in fluid form, depending upon the plug material used.

While the invention has been particularly shown and described with reference to preferred embodiment, it will be understood by those skilled in the art that various changes in form and detail may be made therein without departing from the spirit and scope of the invention.

What is claimed is:

1. A method for making a backside failure analysis capable integrated circuit package having an encapsulated lead frame and die, said method comprising the steps of:
 (a) placing a die and connected lead frame in a packaging mold, said packaging mold having a pedestal protrusion into the mold;
 (b) filling said mold with encapsulating material;
 (c) removing the resulting package from the mold; and
 (d) inserting a fitted plug in a cavity formed by the pedestal protrusion; wherein
 the plug is soluble in a polar organic solvent.

2. A method for making a backside failure analysis capable integrated circuit package having an encapsulated lead frame and die, said method comprising the steps of:

(a) placing a die and connected lead frame in a packaging mold, said packaging mold having a pedestal protrusion into the mold;

(b) filling said mold with encapsulating material;

(c) removing the resulting package from the mold; and (d) backfilling a cavity formed by the pedestal protrusion with a substrate material; wherein
the substrate material can be removed by a solvent without substantially damaging the die.

3. The method of claim 2 wherein the pedestal protrusion is substantially square at the die interface surface.

4. The method of claim 2 wherein the pedestal has tapered side walls.

5. A method for conducting a backside failure analysis on an integrated circuit package having a die with a backside and a backside plug, said method comprising the steps of:

(a) removing the backside plug; and, (b) conducting failure analysis on the backside of the die.

6. The method of claim 5 wherein step (a) is performed by mechanically pulling the plug out of the package.

7. The method of claim 5 wherein step (a) is performed by dissolving the plug with a solvent.

8. A method for forming a package for an integrated circuit device on a die, the method comprising:

placing the die on a lead frame;

forming electrical connections between the lead frame and the die; and, encapsulating the lead frame and die within a package, wherein the die has at least a portion of the backside that is exposed such that analysis of the integrated circuit may be performed, wherein the encapsulating step results in a cavity being formed to expose at least a portion of the backside;

forming a removable plug within the cavity; and removing the removable plug by a chemical process.

9. An integrated circuit system comprising:

a die containing an integrated circuit, the die having a front side and a back side;

a lead frame, wherein the die is mounted on the lead frame such that a portion of the backside is exposed; and, a package encapsulating the die and a portion of the lead frame, wherein the backside of the die is exposed; wherein
the package includes a cavity providing for the exposed portion of the backside of the die; and
a plug is formed within the cavity, wherein the plug is removable by a chemical process.

* * * * *